(12) United States Patent
Teramoto et al.

(10) Patent No.: US 10,077,380 B2
(45) Date of Patent: *Sep. 18, 2018

(54) POLISHING COMPOSITION

(71) Applicant: NITTA HAAS INCORPORATED, Osaka (JP)

(72) Inventors: Masashi Teramoto, Kyoto (JP); Tatsuya Nakauchi, Kyoto (JP); Noriaki Sugita, Kyoto (JP); Shinichi Haba, Kyoto (JP); Akiko Miyamoto, Kyoto (JP)

(73) Assignee: NITTA HAAS INCORPORATED, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/129,836

(22) PCT Filed: Mar. 30, 2015

(86) PCT No.: PCT/JP2015/059923
§ 371 (c)(1),
(2) Date: Sep. 28, 2016

(87) PCT Pub. No.: WO2015/152150
PCT Pub. Date: Oct. 8, 2015

(65) Prior Publication Data
US 2017/0174940 A1 Jun. 22, 2017

(30) Foreign Application Priority Data
Mar. 31, 2014 (JP) .................................. 2014-073436

(51) Int. Cl.
C09G 1/02 (2006.01)
H01L 21/02 (2006.01)

(52) U.S. Cl.
CPC .......... *C09G 1/02* (2013.01); *H01L 21/02024* (2013.01)

(58) Field of Classification Search
None
See application file for complete search history.

(56) References Cited

U.S. PATENT DOCUMENTS

| 7,481,949 | B2 * | 1/2009 | Kawase | C09G 1/02 |
| | | | | 252/79.1 |
| 7,998,229 | B2 * | 8/2011 | Yamada | C09G 1/04 |
| | | | | 106/3 |
| 8,932,952 | B2 * | 1/2015 | Ogata | B24B 37/08 |
| | | | | 216/53 |
| 9,566,685 | B2 * | 2/2017 | Tsuchiya | H01L 21/02024 |
| 9,579,769 | B2 * | 2/2017 | Tsuchiya | B24B 37/044 |
| 2004/0098924 | A1 | 5/2004 | Iwasa | |
| 2004/0127046 | A1 | 7/2004 | Takami | |

(Continued)

FOREIGN PATENT DOCUMENTS

| CN | 1939663 | 4/2007 |
| CN | 102666760 | 9/2012 |

(Continued)

*Primary Examiner* — Allan Olsen
(74) *Attorney, Agent, or Firm* — Clark & Brody

(57) ABSTRACT

Proposed is a polishing composition including hydroxyethyl cellulose, water and abrasive grains, wherein the hydroxyethyl cellulose has a molecular weight of 500,000 or more and 1,500,000 or less, and the mass ratio of the hydroxyethyl cellulose to the abrasive grains is 0.0075 or more and 0.025 or less.

6 Claims, 1 Drawing Sheet

(56) References Cited

U.S. PATENT DOCUMENTS

| | | | |
|---|---|---|---|
| 2004/0127047 | A1 | 7/2004 | Yamada et al. |
| 2006/0150860 | A1 | 7/2006 | Nozaki |
| 2007/0077764 | A1 | 4/2007 | Shimizu |
| 2007/0186485 | A1 | 8/2007 | Iwasa |
| 2007/0186486 | A1 | 8/2007 | Iwasa |
| 2008/0125016 | A1 | 5/2008 | Nakamura et al. |
| 2010/0003821 | A1 | 1/2010 | Morinaga et al. |
| 2012/0270400 | A1 | 10/2012 | Takegoshi et al. |
| 2014/0319411 | A1 | 10/2014 | Sakaida et al. |
| 2015/0210891 | A1 | 7/2015 | Tsuchiya et al. |
| 2015/0210892 | A1 | 7/2015 | Tsuchiya et al. |

FOREIGN PATENT DOCUMENTS

| | | |
|---|---|---|
| JP | 11-140427 | 5/1999 |
| JP | 2004-128070 | 4/2004 |
| JP | 2006-108151 | 4/2006 |
| JP | 2006-183037 | 7/2006 |
| JP | 2007-103515 | 4/2007 |
| JP | 2010-034509 | 2/2010 |
| JP | 2011-061089 | 3/2011 |
| WO | 2004/074180 | 9/2004 |
| WO | 2013/073025 | 5/2013 |
| WO | 2014/030570 | 2/2014 |
| WO | 2014/034425 | 3/2014 |

\* cited by examiner

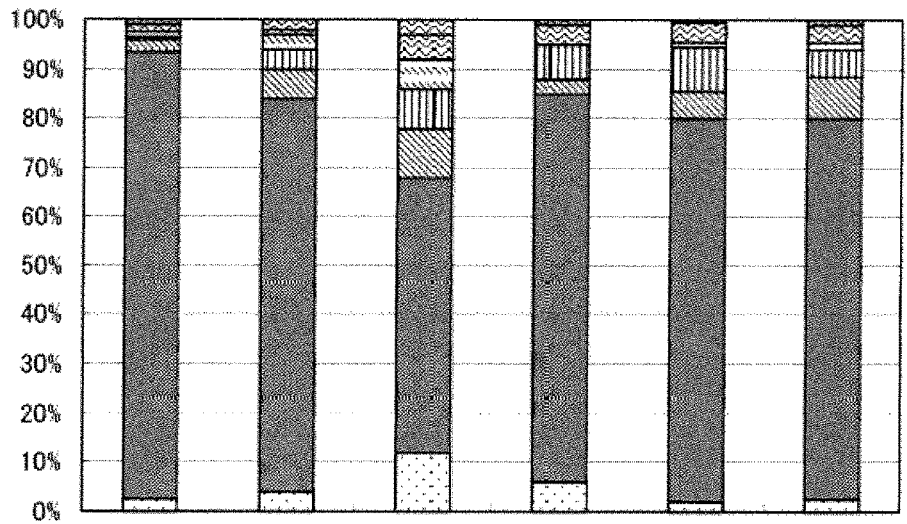
- Others
- Height: more than 50 nm, width: more than 150 nm
- Height: 10 nm or more and 50 nm or less, width: 100 to 300 nm
- Height: 10 nm or more and 30 nm or less, width: 70 to 250 nm
- Height: 3 nm or more and less than 10 nm, width: 50 to 70 nm
- Height: less than 3 nm, width: 150 to 350 nm
- Height: less than 3 nm, width: 50 to 200 nm, length: 200 μm or more

POLISHING COMPOSITION

CROSS-REFERENCE TO RELATED APPLICATION

This application claims priority to Japanese Patent Application No. 2014-73436, the content of which is incorporated herein by reference.

FIELD OF THE INVENTION

The present invention relates to a polishing composition.

BACKGROUND ART

Recently, the miniaturization of semiconductor devices has progressed with the high integration or the like of integrated circuits, and consequently, in addition to high flatness, a high level reduction of surface defects has been required for semiconductor substrates (hereinafter, also simply referred to as substrates) such as semiconductor wafers (hereinafter, also simply referred to as wafers).

For the purpose of reducing such surface defects, polishing of the surface of substrates with a polishing composition including a water-soluble polymer, which is a component enhancing the wettability to semiconductor substrates, has been considered.

Such a polishing composition is described in, for example, Patent Literature 1. Patent Literature 1 describes a polishing composition including hydroxyethyl cellulose as a water-soluble polymer.

Surface defects having various sizes are present in a mixed manner on the surface of a substrate before polishing; however, with such a conventional polishing composition as described in Patent Literature 1, it is impossible to selectively remove surface defects having specific sizes. Accordingly, for example, in the case where a large number of surface defects having specific sizes are present on the substrate surface, or in the case where polishing is performed for the purpose of removing surface defects having specific sizes among the surface defects present in a mixed manner, there is a problem that it is impossible to sufficiently remove the surface defects having the targeted sizes with the polishing composition described in Patent Literature 1.

CITATION LIST

Patent Literature

Patent Literature 1: Japanese Patent Laid-Open No. 2010-34509

SUMMARY OF THE INVENTION

Technical Problem

Accordingly, in view of such conventional problems as described above, an object of the present invention is to provide a polishing composition capable of selectively reducing the surface defects having specific sizes present on the surface of a polishing object such as a semiconductor substrate.

Solution to Problem

The polishing composition according to the present invention includes hydroxyethyl cellulose, water and abrasive grains, wherein the hydroxyethyl cellulose has a molecular weight of 500,000 or more and 1,500,000 or less, and the mass ratio of the hydroxyethyl cellulose to the abrasive grains is 0.0075 or more and 0.025 or less.

In the present invention, the abrasive grains may be contained in an amount of 5% by mass or more and 20% by mass or less.

In the present invention, the polishing composition may further include ammonia.

In this case, the ammonia may be contained in an amount of 0.1% by mass or more and 1.0% by mass or less.

BRIEF DESCRIPTION OF THE DRAWINGS

FIG. 1 is a graph showing the proportions of surface defects after polishing.

DETAILED DESCRIPTION OF THE PREFERRED EMBODIMENT

Hereinafter, the polishing composition according to the present invention is described.

The polishing composition of the present embodiment includes hydroxyethyl cellulose, water and abrasive grains, wherein the molecular weight of the hydroxyethyl cellulose is 500,000 or more and 1,500,000 or less, and the mass ratio of the hydroxyethyl cellulose to the abrasive grains is 0.0075 or more and 0.025 or less.

As the hydroxyethyl cellulose in the present embodiment, hydroxyethyl cellulose having a molecular weight of 500,000 or more and 1,500,000 or less, preferably 800,000 or more and 1,200,000 or less is used.

The molecular weight falling within the above-described range allows the polishing composition to exert removability particularly excellent for the surface defects having specific sizes in a polishing object.

Hydroxyethyl cellulose can improve the wettability; in particular, the hydroxyethyl cellulose having the molecular weight falling within the above-described range improves the wettability to a polishing object, and can reduce the particles and the like on the surface of the polishing object after polishing.

The molecular weight of hydroxyethyl cellulose in the present embodiment means the weight average molecular weight measured by using the GFC (Gel Filtration Chromatography) method, and specifically means the value measured by the measurement method shown in below-described Examples.

The polishing composition of the present embodiment includes water. The hydroxyethyl cellulose is a hydrophilic polymer, hence easily yields an aqueous solution when mixed with water, and thus, as described above, can exert functions such as improvement in the removability of the surface defects having specific sizes in a polishing object and the wettability.

The content of water is not particularly limited; water can be appropriately mixed.

When the polishing composition is used as diluted at the time of use, the polishing composition is prepared as a high-concentration liquid having a higher concentration than the concentration desired at the time of use, and water may be mixed as a diluting liquid at the time of dilution.

The polishing composition of the present embodiment includes abrasive grains.

Examples of the abrasive grains include: grains made of metal oxides such as silica, alumina, ceria and titania; silicon nitride grain; silicon carbide grain; and boron nitride grain.

Preferable among these is silica; particularly preferable among these is colloidal silica such as spherical or non-spherical colloidal silica.

When the abrasive grains are colloidal silica, a hydroxyethyl cellulose aqueous solution is easily adsorbed to the abrasive grains and the removability of the surface defects having specific sizes can be more enhanced, as described below, and thus it is preferable.

Of the colloidal silicas, non-spherical colloidal silica is preferable. Non-spherical colloidal silica allows the hydroxyethyl cellulose aqueous solution to be more easily adsorbed thereto through the concomitant presence with hydroxyethyl cellulose in the polishing composition and allows the removability of the surface defects having specific sizes to be more enhanced, as described below, and thus it is preferable.

In the polishing composition of the present embodiment, the ratio of the content (% by mass) of the hydroxyethyl cellulose to the content (% by mass) of the abrasive grains is 0.0075 or more and 0.025 or less and preferably 0.0075 or more and 0.02 or less.

The ratio of the content (% by mass) of the hydroxyethyl cellulose to the content (% by mass) of the abrasive grains in the polishing composition falling within the above-described range allows the removability of the surface defects having specific sizes to be more enhanced. At the same time, such a ratio as described above allows the wettability of the surface of a polishing object after polishing to be improved.

The content of the abrasive grains in the polishing composition of the present embodiment is not particularly limited, but is, for example, 5% by mass or more and 20% by mass or less.

The content of the abrasive grains falling within the above-described range is preferable, because such a content allows the polishing speed to be regulated appropriately.

The grain size of the abrasive grains is not particularly limited, but examples of the grain size include an average grain size of 50 nm or more. The average grain size of the abrasive grains falling within the above-described range is preferable because the surface defects having specific sizes present on the surface of a polishing object can be more selectively reduced.

The average grain size of the present embodiment is measured by using the DLS (dynamic light scattering) method. More specifically, the average grain size of the present embodiment means the average grain size in the polishing composition, as measured by using an apparatus described in below-described Examples. In other words, when the abrasive grains form clusters in the polishing composition as described below, the average grain size means the average grain size of the clusters.

The polishing composition of the present embodiment includes the hydroxyethyl cellulose, water and the abrasive grains, and consequently the following interactions are considered to occur.

Specifically, in the polishing composition, part of the hydroxyethyl cellulose is adsorbed to the surface of the abrasive grains such as colloidal silica. Accordingly, in the polishing composition, there are the hydroxyethyl cellulose in a state of being adsorbed to the abrasive grains, and the hydroxyethyl cellulose not adsorbed to the abrasive grains and mixed in the polishing composition. It is considered that when the hydroxyethyl cellulose is adsorbed to the abrasive grains, the abrasive grains form clusters through the action of the hydroxyethyl cellulose. The larger the molecular weight of the hydroxyethyl cellulose or the larger the content of the hydroxyethyl cellulose in the polishing composition, the larger the clusters tend to be.

It is considered that depending on the size and the amount of the clusters, performance of reducing the surface defects having specific sizes present on the surface of a polishing object is varied.

The hydroxyethyl cellulose not adsorbed to the abrasive grains and mixed in the polishing composition can improve the wettability to a polishing object.

Accordingly, it is considered that by establishing a balance between the hydroxyethyl cellulose adsorbed to the abrasive grains and the hydroxyethyl cellulose not adsorbed to the abrasive grains, the polishing composition of the present embodiment can reduce the surface defects having specific sizes present on the surface of a polishing object.

In the polishing composition of the present embodiment, the proportion of the hydroxyethyl cellulose adsorbed to the abrasive grains is preferably 30% by mass or more and 99% by mass of the total amount of the hydroxyethyl cellulose in the polishing composition.

When hydroxyethyl cellulose having a molecular weight of 800,000 to 1,000,000 is used as the hydroxyethyl cellulose, the proportion of the hydroxyethyl cellulose adsorbed to the abrasive grains is 60% by mass or more and 99% by mass or less, and preferably 70% by mass or more and 99% by mass or less of the total amount of the hydroxyethyl cellulose in the polishing composition.

When hydroxyethyl cellulose having a molecular weight of 500,000 to 800,000 is used as the hydroxyethyl cellulose, the proportion of the hydroxyethyl cellulose adsorbed to the abrasive grains is 30% by mass or more and 99% by mass or less of the total amount of the hydroxyethyl cellulose in the polishing composition.

In the present embodiment, the grain size of the abrasive grains (clusters) and the proportion of the hydroxyethyl cellulose adsorbed to the abrasive grains mean the grain size and the proportion at the time of use of the polishing composition, respectively.

The polishing composition of the present embodiment may further include ammonia.

The inclusion of ammonia allows the surface defects having specific sizes present on the surface of a polishing object to be reduced more sufficiently, and thus it is preferable.

The content of ammonia is not particularly limited, but, examples of the content of ammonia include 0.1% by mass or more and 1.0% by mass or less, and preferably 0.25% by mass or more and 0.75% by mass or less.

The content of ammonia falling within the above-described range allows the surface defects having specific sizes present on the surface of a polishing object to be more sufficiently reduced, and thus it is preferable.

The content of ammonia falling within the above-described range also allows the pH of the polishing composition to be regulated so as to fall within an appropriate range, and thus it is preferable.

The polishing composition of the present embodiment may further include other components.

Examples of the other components include: a pH adjuster, a surfactant and a chelating agent.

The polishing composition of the present embodiment may be prepared as a high concentration liquid having a higher concentration than the desired concentration at the time of use, and may be diluted at the time of use.

When the polishing composition is prepared as such a high concentration liquid, the high concentration liquid is convenient for storage and transportation.

When the polishing composition is prepared as a high concentration liquid, examples of the preparation include a preparation in which the high concentration liquid is prepared so as to have a concentration capable of being diluted at the time of use by a factor of approximately, for example, 5 to 100-fold, preferably 20 to 60-fold and more preferably 21 to 41-fold.

The polishing composition of the present embodiment is used for the polishing of polishing objects required to have a high flatness and a high-level reduction in the surface defects as in semiconductor substrates such as semiconductor wafers. In these polishing objects, fine surface defects are also required to be sufficiently removed.

For example, on the surface of the wafers, there are surface defects having various sizes and various shapes. Specifically, for example, minute surface defects having heights of less than 10 nm and surface defects relatively larger in size, having heights of 10 nm or more, are present in a mixed manner. Moreover, among the minute surface defects having heights of less than 10 nm, there are relatively larger surface defects having heights of 3 nm or more and particularly minute surface defects having heights of less than 3 nm. In order to reduce such surface defects having various sizes, the polishing is performed a plurality of times. For example, it is considered that by the first polishing, the surface defects having larger sizes are made smaller, and by the final polishing, minute surface defects are removed.

The height and the width of a surface defect as referred to in the present embodiment means the height and the width as measured with an atomic force microscope (AFM).

The determination of the presence or absence of the surface defects is performed by using the count of the number of the surface defects. Accordingly, when there are countable surface defects regardless of the sizes of the defects, the number of counts is large and it is determined that the surface defects are not reduced. However, in the above-described plurality of times of polishing, when the surface defects having large sizes remain in the final polishing stage even in a small number, the surface defects cannot be sufficiently reduced in the final polishing designed for the purpose of removing minute surface defects. Accordingly, it is important to remove, before the final polishing, the surface defects having sizes hardly removable in the final polishing, instead of reducing the number of counts of the surface defects.

The polishing composition of the present embodiment can remove the surface defects having specific sizes. Examples of the surface defects having the sizes removable in the largest number with the polishing composition of the present embodiment include relatively larger surface defects having heights of 3 nm or more and less than 10 nm. In other words, the polishing composition of the present embodiment leaves the relatively smaller minute surface defects having heights of less than 3 nm, and can efficiently remove the surface defects having relatively larger sizes of 3 nm or more in height.

The polishing composition of the present embodiment can remove the surface defects having such specific sizes, and consequently has the following merits. Specifically, in such a case of performing a plurality of times of polishing as described above, by using the polishing composition of the present embodiment as the polishing composition before the final polishing, the surface defects of a polishing object after the final polishing can be sufficiently reduced. Alternatively, by using the polishing composition of the present embodiment as the polishing composition for polishing a polishing object having a large number of relatively larger surface defects, the surface defects can be sufficiently reduced.

The surface of a semiconductor substrate that is a polishing object having been subjected to the treatment with the polishing composition of the present embodiment has such a configuration in which the proportion of the number of counts of relatively small surface defects having heights of less than 3 nm of the surface defects measured by using a surface defect inspection apparatus such as a confocal optical system laser microscope (MAGICS M5640, manufactured by Lasertec Corp.) is 45% or more, preferably 70% or more and more preferably 90% or more of the number of counts of the whole of the surface defects. In other words, the surface of the semiconductor substrate is in a state in which the remaining proportion of the surface defects other than the relatively small surface defects is small.

The polishing composition of the present embodiment is as described above, but it should be construed that the embodiment disclosed is presented in all aspects as exemplification for describing the present invention, and the present invention is not limited to the embodiment. The scope of the present invention is defined not by the foregoing description but by the appended claims, and is intended to include all the modifications in the meaning of equivalence to the claims and within the scope of the present invention.

The present inventors made a diligent study in order to solve such problems as described above, and consequently have achieved the present invention by discovering that surface defects having specific sizes can be selectively reduced by allowing the polishing composition to include hydroxyethyl cellulose having a specific molecular weight and abrasive grains in a specific ratio.

The polishing composition according to the present invention is a polishing composition including hydroxyethyl cellulose, water and abrasive grains, wherein the molecular weight of the hydroxyethyl cellulose is 500,000 or more and 1,500,000 or less, and the mass ratio of the hydroxyethyl cellulose to the abrasive grains is 0.0075 or more and 0.025 or less.

According to the present invention, the hydroxyethyl cellulose has a molecular weight of 500,000 or more and 1,500,000 or less, and the mass ratio of the hydroxyethyl cellulose to the abrasive grains is 0.0075 or more and 0.025 or less, and hence the surface defects having specific sizes present on the surface of a polishing object can be selectively reduced.

In the present invention, when the content of the abrasive grains in the polishing composition falls within such a range as described above, the surface defects having specific sizes present on the surface of a polishing object can be more selectively reduced.

In the present invention, when the polishing composition further includes ammonia, the surface defects having specific sizes present on the surface of a polishing object can be more sufficiently reduced.

When the polishing composition includes ammonia in such a content range as described above, the surface defects having specific sizes present on the surface of a polishing object can be more selectively reduced.

As described above, according to the present invention, the surface defects having specific sizes present on the surface of a polishing object such as a semiconductor substrate can be selectively reduced.

EXAMPLES

Hereinafter, Examples of the present invention are described; however, the present invention is not limited to these Examples.

(Hydroxyethyl Cellulose)

The hydroxyethyl celluloses shown in Table 1 having different molecular weights (500,000, and 1,000,000) were prepared.

The molecular weights of the hydroxyethyl celluloses are the molecular weights measured by the following method.

(Measurement of Molecular Weight)

The molecular weight is a value of the weight average molecular weight obtained by the following measurement.

The measurement was performed by using a GFC apparatus (Model PU-2085 plus system, manufactured by JASCO Corp.) as the measurement apparatus, two serially connected columns Asahipak GF-71.0HQ and Asahipak GF-310HQ manufactured by Shodex Co., Ltd., and a 0.7% aqueous solution of sodium chloride as an eluent.

The hydroxyethyl cellulose (HEC), the abrasive grains (silicon dioxide produced by sol-gel method, grain size in water: 66 nm by dynamic light scattering), ammonia and the balance water were mixed according to the compositions shown in Table 1, to yield the polishing compositions of Examples and Comparative Example.

The polishing compositions were each diluted by a factor of 41-fold with water, silicon wafers (12 inch) as objects to be polished were polished with the diluted polishing compositions under the following polishing conditions, the surface defects after polishing were measured by the following method, and the results thus obtained are shown in Table 1.

(Polishing Conditions)

Polishing apparatus: SPP800S (manufactured by Okamoto Machine Tool Works, Ltd.)

Polishing pad: POLYPAS 24T (manufactured by Fujibo Ehime Co., Ltd.)

Platen speed: 40 rpm

Polishing load: 120 gf/cm$^2$

Flow rate: 0.6 L/min

Object to be polished: 12-inch Silicon wafer

Polishing time: 300 sec (Measurement Method of Surface Defects)

The wafers after polishing under the above-described polishing conditions were washed with an ammonia/hydrogen peroxide mixed liquid, and then the measurement (edge exclusion EE: 5 mm, Slice level: D37 mV) of the surface defects was performed by using a measurement apparatus (MAGICS M5640, manufactured by Lasertec Corp.).

On the basis of the coordinates of the defects measured by MAGICS, the measurement of the defects was performed by using the measurement apparatus AFM SAP465 (manufactured by Seiko Instruments Inc.).

From these two types of measurement results, the surface defects were classified into Types A to F by the following method, and the proportions of the respective surface defects are shown in the graph of FIG. 1. In Table 1, the proportions of the respective types are shown by percent.

(Classification of MAGIC Review Images)

In the classification method of the MAGICS review images, according to the order of the white and black portions varying from the left toward the right of the image in the defective portions of each of the review images, the MAGIC review images were classified into the following Types A to F. For the analysis of the MAGICS review images, a band pass filter was used.

On a MAGICS review image, due to the effect of the band pass filter, when the defects are extremely small (low), the color varies three times as a sequence of white→black-→white or as a sequence of black→white→black. Which of the sequence of white→black→white and the sequence of black→white→black corresponds to the low height defects is analyzed with AFM.

Type A: White-black-white, and scratch-like image
Type B: White-black-white
Type C: Black-white-black
Type D: White-black
Type E: Black-white
Type F: Black (Dimension of Surface Defects)

The respective types of the defects were measured with AFM, and the dimensions of the respective types of defects were found to fall within the following ranges.

Specifically, the defects were classified into the following types A to F.

Type A: Height: less than 3 nm, width: 50 to 200 nm, length: 200 or more

Type B: Height: less than 3 nm, width: 150 to 350 nm

Type C: Height: 3 nm or more and less than 10 nm, width: 50 to 70 nm

Type D: Height: 10 nm or more and 30 nm or less, width: 70 to 250 nm

Type E: Height: 10 nm or more and 50 nm or less, width: 100 to 300 nm

Type F: Height: more than 50 nm, width: more than 150 nm

Type A is a scratch-like defect having a length component, and Types B to F are dot-like or irregular defects.

(pH)

The pH of each of the polishing compositions and the pH of each of the 41-fold diluted liquids of these polishing compositions at a liquid temperature of 25° C. were measured with a pH meter (manufactured by Horiba, Ltd.).

(Measurement of Adsorbed Hydroxyethyl Cellulose)

Each of the polishing compositions was diluted by a factor of 41-fold with water, a 1.5 mg sample was obtained from the diluted polishing composition, and the sample was centrifugally separated by using the centrifuge MCD-2000 (manufactured by As One Corp) at 14,000 rpm for 10 min. Subsequently, each of the centrifuged samples was separated into the precipitate and the supernatant liquid, the supernatant liquid was removed, and the TOC (Total Organic Carbon) amount of each of the supernatant liquids and the TOC of each of the polishing compositions were measured with the measurement apparatus Sievers 900 (manufactured by GE Co.). From the measurement results, the proportion of the adsorbed hydroxyethyl cellulose in each of the polishing compositions was calculated by the following formula 1, and the results thus obtained are shown in Table 1.

Proportion of adsorbed hydroxyethyl cellulose (%)= (TOC of polishing composition−TOC of supernatant liquid)/(TOC of polishing composition)×100 (Formula 1)

(Measurement of Grain Size of Clusters)

The grain size of the abrasive grains (clusters) in the 41-fold diluted liquid of each of the polishing compositions was measured.

The grain sizes were measured by using, as the measurement apparatus, the zeta potential/grain size measurement system ELSZ-2 (manufactured by Otsuka Electronics Co., Ltd.). The results thus obtained are shown in Table 1.

TABLE 1

|  | Silica concentration | Abrasive grain concentration (%) | NH$_3$ concentration | NH$_3$ concentration (%) | HEC concentration | HEC concentration (%) | HEC concentration/ silica concentration | Molecular weight of HEC |
|---|---|---|---|---|---|---|---|---|
| Example 1 | 95000 | 9.5 | 5000 | 0.5 | 1500 | 0.15 | 0.0158 | 1000000 |
| Example 2 | 95000 | 9.5 | 5000 | 0.5 | 750 | 0.075 | 0.0079 | 1000000 |
| Comparative Example 1 | 95000 | 9.5 | 5000 | 0.5 | 3000 | 0.3 | 0.0316 | 1000000 |
| Example 3 | 95000 | 9.5 | 2500 | 0.25 | 1500 | 0.15 | 0.0158 | 1000000 |
| Example 4 | 95000 | 9.5 | 7500 | 0.75 | 1500 | 0.15 | 0.0158 | 1000000 |
| Example 5 | 95000 | 9.5 | 5000 | 0.5 | 750 | 0.075 | 0.0079 | 500000 |

|  | Grain size (nm) | pH of undiluted liquid | ×41 pH | Proportion of Type A | Proportion of Type B | Proportion of Type C | Proportion of Type D | Proportion of Type E | Proportion of Type F | Others | Adsorbed HEC |
|---|---|---|---|---|---|---|---|---|---|---|---|
| Example 1 | 86.4 | 10.6 | 9.8 | 2.5% | 91.0% | 2.5% | 0.5% | 1.0% | 1.5% | 1.0% | 74% |
| Example 2 | 82.0 | 10.7 | 9.8 | 4.0% | 80.0% | 6.0% | 4.0% | 3.0% | 1.0% | 2.0% | 72% |
| Comparative Example 1 | 102.1 | 10.5 | 9.8 | 12.0% | 56.0% | 10.0% | 8.0% | 6.0% | 5.0% | 3.0% | 64% |
| Example 3 | 142.7 | 10.3 | 9.6 | 6.0% | 79.0% | 3.0% | 7.0% | 0.0% | 4.0% | 1.0% | 82% |
| Example 4 | 84.7 | 10.8 | 9.9 | 2.0% | 78.1% | 5.5% | 9.0% | 1.0% | 4.0% | 0.5% | 72% |
| Example 5 | 75.8 | 10.8 | 9.8 | 2.5% | 77.6% | 8.5% | 5.5% | 1.5% | 3.5% | 1.0% | 39% |

As can be seen from Table 1, the proportions of Type B surface defects were large on the surfaces of the wafers after polishing with the polishing compositions of Examples. In other words, the surface defects other than Type B surface defects were sufficiently removed.

The invention claimed is:

1. A polishing composition comprising hydroxyethyl cellulose, water and abrasive grains,
    wherein the hydroxyethyl cellulose has a molecular weight of 500,000 or more and 1,500,000 or less;
    the mass ratio of the hydroxyethyl cellulose to the abrasive grains is 0.0075 or more and 0.025 or less; and
    a content of the hydroxyethyl cellulose is 0.075% by mass or more and 0.15% by mass or less.

2. The polishing composition according to claim 1, wherein the abrasive grains are contained in an amount of 5% by mass or more and 20% by mass or less.

3. The polishing composition according to claim 2, further comprising ammonia.

4. The polishing composition according to claim 3, wherein the ammonia is contained in an amount of 0.1% by mass or more and 1.0% by mass or less.

5. The polishing composition according to claim 1, further comprising ammonia.

6. The polishing composition according to claim 5, wherein the ammonia is contained in an amount of 0.1% by mass or more and 1.0% by mass or less.

* * * * *